United States Patent [19]

Miura-Mattausch

[11] Patent Number: 5,761,082
[45] Date of Patent: Jun. 2, 1998

[54] METHOD FOR MANUFACTURING AN INTEGRATED CIRCUIT

[75] Inventor: Mitiko Miura-Mattausch, Brunnthal, Germany

[73] Assignee: Siemens Aktiengesellschaft, Munich, Germany

[21] Appl. No.: 799,493

[22] Filed: Feb. 12, 1997

Related U.S. Application Data

[63] Continuation of Ser. No. 298,169, Aug. 30, 1994, abandoned.

[30] Foreign Application Priority Data

Oct. 1, 1993 [DE] Germany ............................ 4333601.9

[51] Int. Cl.[6] ........................................ G06F 17/50
[52] U.S. Cl. .................... 364/490; 364/488; 364/489; 364/468.28
[58] Field of Search ........................ 364/488, 489, 364/490, 578, 468.28

[56] References Cited

U.S. PATENT DOCUMENTS

| | | | |
|---|---|---|---|
| 4,907,180 | 3/1990 | Smith | 364/578 |
| 5,051,911 | 9/1991 | Kimua et al. | 364/468 |
| 5,245,543 | 9/1993 | Smayling et al. | 364/468 |
| 5,345,401 | 9/1994 | Tani | 364/578 |
| 5,440,160 | 8/1995 | Vinal | 257/327 |

OTHER PUBLICATIONS

IEEE Journal of Solid–State Circuits, vol. SC–15, No. 4, Aug., 1980, Soo–Young Oh et al "Transient Analysis of MOS Transistors", pp. 636–643.

H.J. Park, "Charge Sheet and Non–Quasistatic Mosfet Models for Spice", Ph.D. dissertation Memorandum No. UCB/ERL M89/20, Electronics Research Lab., Dep. EECS, University of California Berkeley, Feb. 24, 1989.

A Physical Charge–Controlled Model for MOS Transistors—Maher et al.—XP 000605636—The MIT Press—Advanced Research in VLSI—pp. 212–229.

Holberg et al., "CMOS Analog Circuit Design," HRW, 1987, pp. 95–147.

Park et al., "A Charge Sheet Capacitance Model of Short Channel MOSFET for Spice," IEEE, 1991, pp. 376–389.

Howes et al., "A Charge Conserving SOS Spice MOSFET Model for Analog Design," IEEE, pp. 2160–2163.

Agostinelli et al., A Comprehensive Model for Inversion Layer Hole Mobility for Simulation of Submicrometer MOSFET's, IEEE, 1991, pp. 151–159.

Howes et al., "An SOS MOSFET Model Based on Calculation of the Surface Potential," IEEE, 1994, pp. 494–508.

*Primary Examiner*—Vincent N. Trans
*Assistant Examiner*—Thai Phan
*Attorney, Agent, or Firm*—Hill & Simpson

[57] ABSTRACT

For manufacturing an integrated circuit, the production of a design for the circuit that comprises a plurality of MOS transistors is controlled by employment of a circuit simulator.

$$I_{ds}, Q, V, \frac{\partial I_{ds}}{\partial V}, \text{ and } \frac{\partial Q}{\partial V}$$

are calculated in the circuit simulator for the terminal nodes of the MOS transistors upon prescription of the voltages between gate and source $V_{gs}$, between drain and source $V_{ds}$, and between the substrate and source $V_{bs}$ in a consistent transistor model wherein drift, diffusion and short-channel effects are taken into consideration.

4 Claims, 2 Drawing Sheets

METHOD FOR MANUFACTURING AN INTEGRATED CIRCUIT

This is a continuation of application Ser. No. 08/298,169, filed Aug. 30, 1994, abandoned now.

BACKGROUND OF THE INVENTION

Modern integrated circuits frequently comprise $10^6$ or more transistors.

A circuit diagram is first produced on the basis of a functional description of the circuit for manufacturing such complex integrated circuits. The properties of the circuit are calculated with the assistance of a circuit simulator. Given deviations of the switching behavior from the required functional description, modifications of the circuit diagram are undertaken and the modified circuit diagram is again calculated in the circuit simulator. This cycle is run through until the properties of the circuit diagram agree with the required specifications. The production of a layout then occurs. The masks for the process sequence, with which the integrated circuit is ultimately realized, are produced on the basis of the layout.

The relevant electrical circuit quantities for MOS transistors are calculated in the circuit simulator with the assistance of a transistor model for the terminal nodes of the MOS transistor, i.e. source, drain, gate, and substrate. How well the switching behavior of the integrated circuit realized at the end coincides with the production with the circuit simulator is critically dependent on the quality of the transistor model.

For checking transistor models, simulation calculations of ring oscillators are compared to measurements of the ring oscillators. It turns out that the ring oscillator frequencies identified in the simulation calculations do not agree with the measured frequencies. The discrepancy becomes greater with increasing reduction of the structural sizes of the MOS transistors.

It has been proposed to modify the transistor models by introducing fit parameters which realistically reflect the physical conditions below strong inversion region, even given reduced structural size of the transistors; see, for example, H. J. Park, "Charge Sheet and Non-Quasistatic MOSFET Models for SPICE", Ph.D. dissertation Memorandum No. UCB/ERL M89/20, Electronics Research Lab., Dep. EECS, University of California, Berkeley, Feb. 24, 1989, incorporated herein.

The fit parameters are identified by comparing simulation calculations to measurements. Transient measurements can be required for this purpose.

Since the required fit parameters are non-physical, no reliable predictions for the fit parameters can be made for a modified transistor technology or reduced structural size. Renewed measurements are required for every transistor design.

SUMMARY OF THE INVENTION

It is an object of the invention to specify a method for manufacturing an integrated circuit wherein the production of a design for the circuit is controlled upon employment of a circuit simulator for which a matching of fit parameters to measurements is not required.

According to the method of the invention for manufacturing an integrated circuit having a plurality of MOS transistors, a circuit simulator is employed to produce a design for the circuit to be integrated. The circuit simulator is utilized to calculate drain current $I_{ds}$ and overall charges Q for terminal nodes source, drain, gate, and substrate as well as for an inversion layer and derivations $$\frac{\partial I_{ds}}{\partial V} \text{ and } \frac{\partial Q}{\partial V}$$

for the terminal nodes of the MOS transistors for upon prescribed voltages between gate and source $V_{gs}$, between drain and source $V_{ds}$ and between the substrate and source $V_{bs}$. These parameters are calculated by solving the following equations:

$$Q_i(y) = \bar{c}C_{ox}(V_G - \phi_s(y)) - Q_b(y)$$

$$Q_b(y) = -qN_{sub}L_D \sqrt{2\beta\phi_s(y) - 1}$$

with $$V_G = V_{gs} - V_{fb} - \Delta V_G$$

$$\Delta V_G = \frac{\epsilon_{si}}{C_{ox}} \sqrt{\frac{2\epsilon_{si}}{qN_{sub}} \phi_{si}} (y) E_{yy}$$

$$\beta = \left[\frac{kT}{q}\right]^{-1}$$

$$Q_I = W \int_O^L Q_i(y) dy$$

$$Q_B = W \int_O^L Q_b(y) dy$$

$$Q_G = -(Q_I + Q_B)$$

$$Q_I = Q_S + Q_D$$

$$Q_D = W \int_O^L \frac{y}{L} Q_i(y) dy$$

$$Q_S = W \int_O^L \left(1 - \frac{y}{L}\right) Q_i(y) dy$$

$$I_{ds} = -\frac{W\mu}{L} \int Q_i(y) \frac{d\phi_s(y)}{dy} dy$$

$$\frac{d\phi_s(y)}{dy} - \frac{d\phi_s(y)}{dy} - \frac{1}{\beta} \frac{d \ln Q_i(y)}{dy}$$

$$-Q_i(y) = qN(y)$$

where:

$C_{ox}$ is oxide capacitance, $\phi_s(y)$ is surface potential, q is electronic charge, $N_{sub}$ is dopant concentration in the substrate, $L_D$ is Debye length, $V_{fb}$ is flat-band voltage, $Q_i(y)$, $Q_b(y)$ are location-dependent charges in the inversion layer or the substrate per unit area, $V_{gs}$ is the voltage between gate and source, $\epsilon_{si}$ is the dielectric constant of silicon, $E_{yy}$ is a gradient of a lateral electrical field in the channel, $\beta$ is thermic voltage, $Q_I$, $Q_B$, $Q_G$, $Q_S$, $Q_D$ are respectively overall charge in the inversion layer, in the substrate, in the gate, in the source, and in the drain, W is channel width, L is channel length, $I_{ds}$ is drain current, $\phi_f$ is quasi-fermi potential, N(y) is a location-dependent dopant concentration in the channel, and μ is mobility.

In the method of the invention, the electrical quantities of the transistors are calculated according to a transistor model that takes the motion of the charge carriers due to drift and due to diffusion as well as due to the short-channel effect into consideration. This transistor model is consistent, i.e. it describes the physical conditions in the transistor without requiring fit parameters except for the mobility. The mobility μ of the charge carriers can be determined from a standard mobility mode, or by fitting to the measured current $I_{ds}$ between source and drain.

In transistor models previously employed in circuit simulators, the diffusion amount in the charge carrier transport is neglected. This, however, dominates the subthreshold region. The dependency of the charges on the applied voltage is overestimated when the diffusion amount is left out of consideration. The physical conditions are realistically reproduced, since the method of the invention employs a transistor model that takes both the drift as well as the diffusion contribution to the charge carrier transport into consideration and which, beyond, takes short-channel effects into consideration.

DESCRIPTION OF THE PREFERRED EMBODIMENTS

Figure 1:
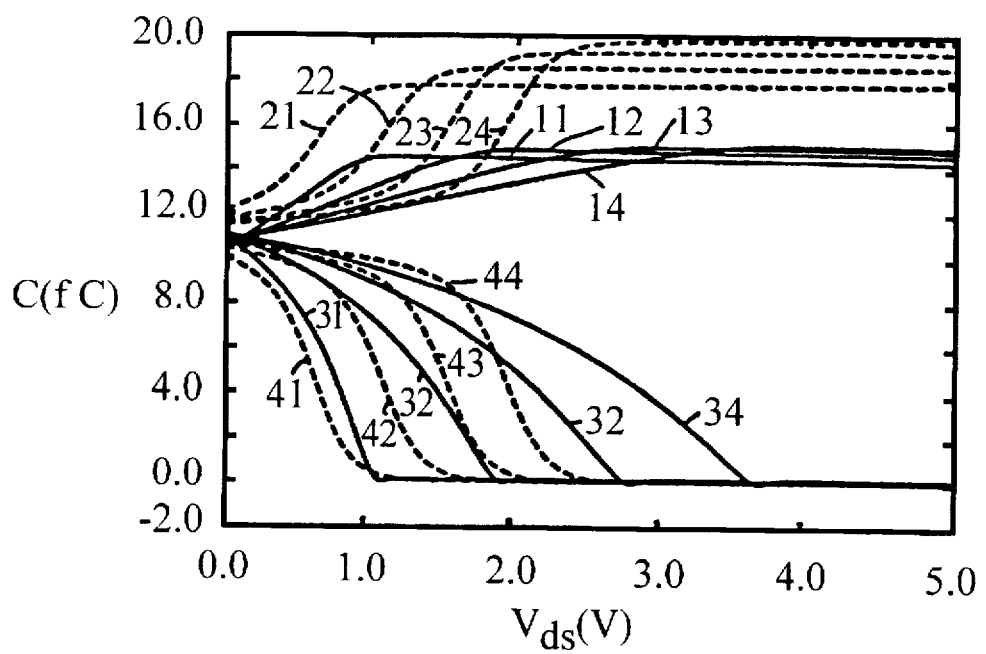
FIG. 1 is a graph illustrating calculated capacitances dependent on applied voltage between source and drain.

FIG. 1 shows calculated intrinsic capacitances for a 0.65 μm channel length dependent on the applied voltage between source and drain $V_{ds}$. The solid-line curves 11, 12, 13, and 14 show the result of the calculations of the capacitance $C_{gs}$ between gate and source according to the transistor model that is employed in the method of the invention, whereby the voltage $V_{gs}$ between gate and source amounts to 1, 2, 3 or, respectively, 4 volts. For comparison, the broken-line curves 21, 22, 23, and 24 show the corresponding capacitances $C_{gs}$ according to a transistor model as employed in known methods and which leaves the diffusion amount and the short-channel effect out of consideration. The solid-line curves 31, 32, 33, and 34 show the result of the calculation of capacitances $C_{gd}$ between gate and drain according to the transistor model that is employed in the method of the invention. The voltage $V_{ds}$ between gate and source again amounts to 1, 2, 3, or 4 volts. For comparison, the broken-line curves 41 are shown, these again reproducing the calculated capacitance $C_{gd}$ between gate and drain according to a conventional transistor model.

Figure 2:
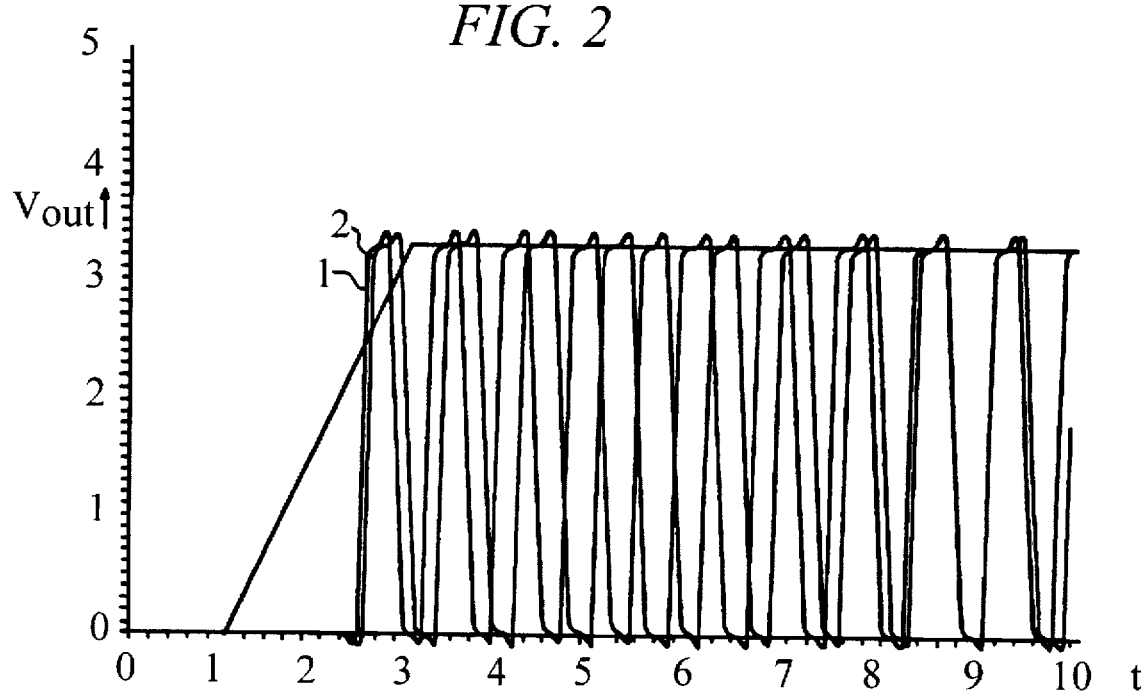
FIG. 2 is a graph illustrating a response function $V_{out}$ of a ring oscillator dependent on time t.

FIG. 2 shows the response function $V_{out}$ of a ring oscillator, dependent on the time t. The curve referenced 1 is thus the result of a calculation upon employment of the consistent transistor model that is employed in the method of the invention. The curve referenced 2 shows the result of the calculation according to a conventional transistor model.

The consistent transistor model employed in the method of the invention is based on charges that are stored in the gate, in the inversion layer, in the drain, in the source, and in the substrate. $Q_g$, $Q_i$, $Q_d$, $Q_s$, and $Q_b$ reference these charges per unit area. Valid for $Q_i$ and $Q_b$ as a function of the location y along the channel are the following equations:

$$Q_i(y) = -C_{ox}(V_G - \phi_s(y)) - Q_b(y) \qquad (1)$$

$$Q_b(y) = -qN_{sub}L_D \sqrt{2\beta\phi_s(y) - 1} \qquad (2)$$

with $$V_G = V_{gs} - V_{fb} - \Delta V_G \qquad (3)$$

$$\Delta V_G = \frac{\epsilon_{si}}{C_{ox}} \sqrt{\frac{2\epsilon_{si}}{qN_{sub}} \phi_s(y)E_{yy}} \qquad (4)$$

$$\beta = \left[\frac{kT}{q}\right]^{-1} \qquad (5)$$

$C_{ox}$ is the oxide capacitance, q is the electronic charge, $N_{sub}$ is the dopant concentration in the substrate, $L_d$ is the Debye length, and $V_{fb}$ is the flat-band voltage. $\phi_s(y)$ is the location-dependent surface potential that is identified by solving the Poisson equation and the drift-diffusion equation. β is the thermal voltage. $\epsilon_{si}$ is the dielectric constant of silicon. $E_{yy}$ is the gradient of the lateral electrical field. $V_{gs}$ is the voltage between gate and source.

The term $\Delta V'_G$ takes the short-channel effect into consideration. Given reduction of the channel length, the lateral electrical field increases, so that the lateral electrical field can even dominate the vertical electrical field for short-channel transistors. $E_{yy}$ can no longer be left out of consideration in this case. The value for $E_{yy}$ is calculated from the measured threshold voltage of the MOS transistor.

The overall charge $Q_i$ in the inversion layer and $Q_B$ in the substrate are calculated by integration over the channel direction y from source to drain:

$$Q_I = W \int_0^L Q_i(y)dy \qquad (6)$$

$$Q_B = W \int_0^L Q_b(y)dy \qquad (7)$$

W is the channel width and L is the channel length. The following is valid for the overall charge on the gate $Q_G$, source $Q_S$, and drain $Q_D$:

$$Q_G = -(Q_I + Q_B) \qquad (8)$$

$$Q_I = Q_S + Q_D \qquad (9)$$

The partitioning of $Q_I$ into $Q_S$ and $Q_D$ is undertaken by the following equations in accordance with S. Y. Oh et al, IEEE J. Solid-State Circuits, SC 15, 1980, pp. 636–643, incorporated herein:

$$Q_D = W \int_0^L \frac{y}{L} Q_i(y)dy \qquad (10)$$

$$Q_S = W \int_0^L \left(1 - \frac{y}{L}\right) Q_i(y)dy \qquad (11)$$

Given the assumption that the current in the channel flows along the surface (charge-sheet approximation), the following is valid for the current $I_{ds}$ between drain and source:

$$I_{ds} = \frac{W\mu}{L} \int Q_i(y) \frac{d\phi_f(y)}{dy} dy \quad (12)$$

with $$\frac{d\phi_f(y)}{dy} = \frac{d\phi_s(y)}{dy} - \frac{1}{\beta} \frac{d \ln Q_i(y)}{dy} \quad (13)$$

$$-Q_i(y) = qN(y) \quad (14)$$

The mobility of the charge carriers is referenced $\mu$. $\phi_f(y)$ is the quasi-Fermi potential that is described taking both the diffusion amount as well as the drift amount into consideration. The term $$\frac{d\phi_s(y)}{dy} \quad (15)$$

thus describes the amount due to drift, and the term $$\frac{1}{\beta} \frac{d \ln Q_i(y)}{dy} \quad (16)$$

describes the diffusion amount.

N(y) is the location-dependent dopant concentration in the inversion layer.

Given the assumption that the mobility $\mu$ is independent of the position in the channel, the following is valid for the drain current $I_{ds}$ in the charge-sheet model:

$$I_{ds}\left[\frac{1}{\beta} \mu \frac{W}{L}\right] = C_{ox}(1 + \beta V_G)(\phi_{SL} - \phi_{SO}) - \frac{\beta}{2} C_{ox}(\phi_{SL}^2 - \phi_{SO}^2) - \quad (17)$$

$$qN_{sub}L_D\left[\frac{2\sqrt{2}}{3}\right] [(\beta\phi_{SL} - 1)^{3/2} - (\beta\phi_{SO} - 1)^{3/2}] +$$

$$qN_{sub}L_D\sqrt{2} [(\beta\phi_{SL} - 1)^{1/2} - (\beta\phi_{SO} - 1)^{1/2}]$$

The value of the surface potential at the source side $\phi_{SO}$ and of the surface potential at the drain side $\phi_{SL}$ are calculated by solving the Poisson equation and equation 13.

By algebraic transformations, the equations for the overall charges Q can be described as functions of $\phi_{SO}$ and $\phi_{SL}$.

The mobility $\mu$ can be calculated from a standard mobility model or from measured characteristics of the MOS transistors.

The quantities $I_{ds}$ required for the circuit simulation as well as the overall charges Q and the intrinsic capacitances, which are the derivations of the charge at the terminal node according to the applied voltages $V_{gs}$ between gate and source, $V_{ds}$ between drain and source, and $V_{bs}$ between substrate and source, are described by algebraic transformation as analytic expressions that are functions of $\phi_{SO}$ and $\phi_{SL}$. $\phi_{SO}$ and $\phi_{SL}$ are directly dependent on technological parameters such as the oxide thickness $T_{XO}$ and the dopant concentration in the substrate $N_{sub}$.

Figure 3:
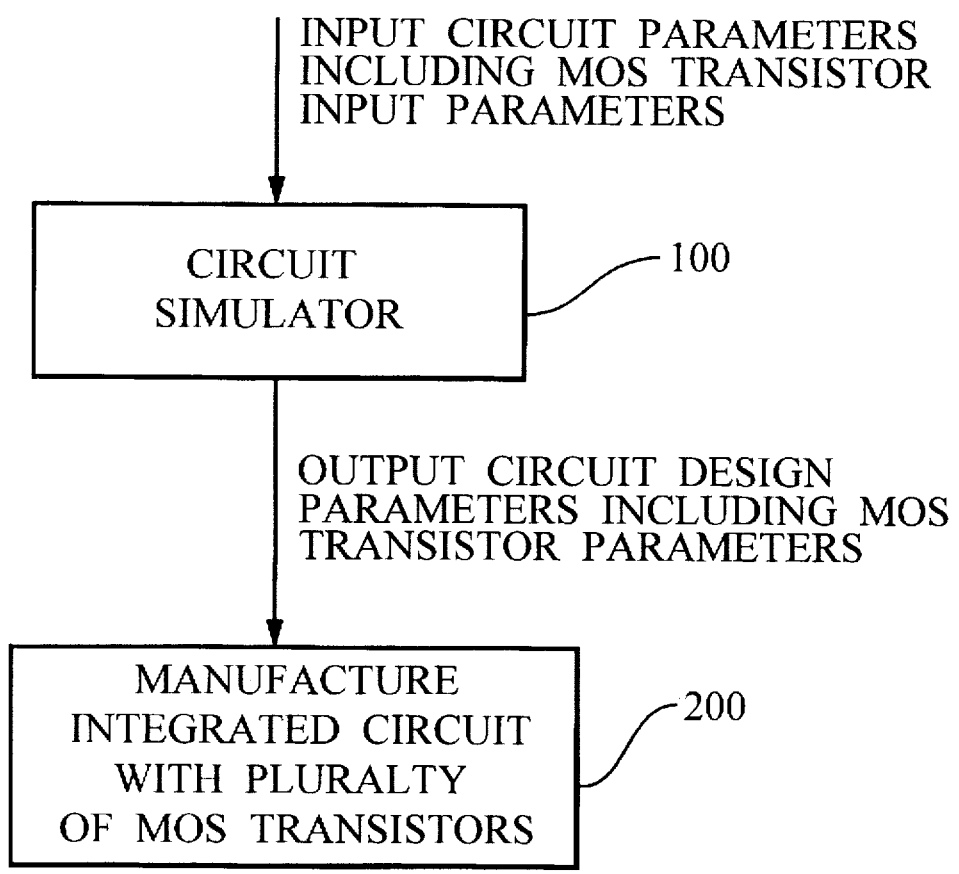
FIG. 3 is a block diagram of the method of the invention for manufacturing an integrated circuit with a plurality of MOS transistors.

As shown in FIG. 3, according to the method of the invention, an integrated circuit is manufactured having a plurality of MOS transistors by employing a circuit simulator 100 to produce a design for the integrated circuit. Into circuit simulator 100 circuit parameters are input, including the input parameters for the MOS transistor as previously described. The circuit simulator 100 outputs the circuit design parameters including the MOS transistor parameters, which are then used in the manufacture of the integrated circuit having the plurality of MOS transistors as shown at 200 in FIG. 3.

Although various minor changes and modifications might be suggested by those skilled in the art, it will be apparent that I wish to include within the scope of the patent warranted hereon all such changes and modifications as reasonably come within my contribution to the art.

I claim as my invention:

1. A method for manufacturing an integrated circuit having a plurality of MOS transistors, comprising the steps of:

employing a circuit simulator to produce a design for the circuit to be integrated containing said plurality of MOS transistors;

calculating with the circuit simulator parameters for said plurality of MOS transistors, said parameters taking into account motion of charge carriers due to drift and due to diffusion as well as due to short-channel effects so that a same transistor model is provided which describes physical conditions in the transistor for substantially an entire operating region of the transistors without requiring fit parameters, except for mobility, for different operating regions, or different models for different operating regions, of each transistor, said parameters including drain current $I_{ds}$, overall charges Q for terminal nodes source, drain, gate, and substrate as well as for an inversion layer, and deviations $$\frac{\partial I_{ds}}{\partial V} \text{ and } \frac{\partial Q}{\partial V}$$

for the terminal nodes of said plurality of MOS transistors upon prescription of voltages between gate and source $V_{gs}$, between drain and source $V_{ds}$ and between the substrate and source $V_{bs}$, said parameters being calculated by solving the following equations:

$$Q_i(y) = -C_{ox}(V_G - \phi_S(y)) - Q_b(y)$$

$$Q_b(y) = -qN_{sub}L_D\sqrt{2(\beta\phi_S(y) - 1)}$$

with $$V_G = V_{gs} - V_{fb} - \Delta V_G$$

$$\Delta V_G = \frac{\epsilon_{si}}{C_{ox}} \sqrt{\frac{2\epsilon_{si}}{qN_{sub}} \phi_S(y)E_{yy}}$$

$$\beta = \left(\frac{kT}{q}\right)^{-1}$$

$$Q_I = W\int_O^L Q_i(y)dy$$

$$Q_B = W\int_O^L Q_b(y)dy$$

$$Q_G = -(Q_I + Q_B)$$

$$Q_I = Q_S + Q_D$$

$$Q_D = W\int_O^L \frac{y}{L} Q_i(y)dy$$

$$Q_S = W\int_O^L \left(1 - \frac{y}{L}\right) Q_i(y)dy$$

-continued $$I_{ds} = -\frac{W\mu}{L} \int Q_i(y) \frac{d\phi_f(y)}{dy}$$

$$\frac{d\phi_f(y)}{dy} = \frac{d\phi_S(y)}{dy} - \frac{1}{\beta} \frac{d \ln Q_i(y)}{dy}$$

$$-Q_i(y) = qN(y)$$

where:

$C_{ox}$ is oxide capacitance, $\phi_S(y)$ is surface potential, q is electronic charge, $N_{sub}$ is dopant concentration in the substrate, $L_D$ is Debye length, $V_{fb}$ is flat-band voltage, $Q_i(y)$, $Q_b(y)$ are location-dependent charges in the inversion layer or the substrate per unit area, $V_{gs}$ is the voltage between gate and source, $\epsilon_{si}$ is dielectric constant of silicon, $E_{yy}$ is a gradient of a lateral electrical field in the channel, $\beta$ is thermic voltage, $Q_I$, $Q_B$, $Q_G$, $Q_S$, $Q_D$ are respectively overall charge in the inversion layer, in the substrate, in the gate, in the source, and in the drain, W is channel width, L is channel length, $I_{ds}$ is drain current, $\phi_f(y)$ is quasi-fermi potential, N(y) is a location-dependent dopant concentration in the channel, and μ is mobility;

for determining the mobility μ, a current-voltage characteristic $I_{ds}(V_{gs}, V_{ds}, V_{bs})$ of a MOS transistor is measured and assuming that μ in the channel of the MOS transistor is location independent, calculating μ from $$I_{ds}\left(\frac{1}{\beta} \mu \frac{W}{L}\right) = C_{ox}(1 + \beta V_G)(\phi_{SL} - \phi_{SO}) - \frac{\beta}{2} C_{ox}(\phi_{SL}^2 - \phi_{SO}^2) -$$

$$qN_{sub}L_D\left(\frac{2\sqrt{2}}{3}\right)((\beta\phi_{SL} - 1)^{3/2}(\beta\phi_{SO} - 1)^{3/2}) +$$

$$qN_{sub}L_D\sqrt{2}\ ((\beta\phi_{SL} - 1)^{1/2} - (\beta\phi_{SO} - 1)^{1/2})$$

where:

$\phi_{SO}$ is a surface potential at the source side, $\phi_{SL}$ is a surface potential at the drain side, $C_{ox}$ is oxide capacitance, W is channel width, L is channel length, $\beta$ is thermic voltage, q is electronic charge, $L_D$ is Debye length, $\phi_f(y)$ is quasi-fermi potential, $I_{ds}$ is drain-source current, $V_{gs}$ is gate-source voltage, $V_{ds}$ is drain-source voltage, $V_{bs}$ is substrate-source voltage, $N_{sub}$ is dopant concentration in the substrate, $$V'_G = V_{gs} - V_{fb} - \Delta V'_G$$

$$\Delta V_G = \frac{\epsilon_{si}}{C_{ox}} \sqrt{\frac{2\epsilon_{si}}{qN_{sub}} \phi_S(y)E_{yy}}$$

$V_{fb}$ is flat-band voltage, $\epsilon_{si}$ is dielectric constant of silicon, $E_{yy}$ is a gradient of a lateral electrical field in the channel, and $\phi_f(y)$ is quasi-fermi potential; and using said design and said calculated parameters for each of said plurality of MOS transistors, manufacturing said integrated circuit with said plurality of MOS transistors.

2. A method for manufacturing an integrated circuit having a plurality of MOS transistors, comprising the steps of:

employing a circuit simulator to produce a design for the circuit to be integrated containing said plurality of MOS transistors;

calculating with the circuit simulator parameters for said plurality of MOS transistors, said parameters taking into account motion of charge carriers due to drift and due to diffusion as well as due to short-channel effects so that a same transistor model is provided which describes physical conditions in the transistor for substantially on entire operating region of the transistors without requiring fit parameters, except for mobility, for different operating regions, or different models for different operating regions, of each transistor, said parameters including drain current $I_{ds}$, overall charges Q for terminal nodes source, drain, gate, and substrate as well as for an inversion layer, and deviations $$\frac{\partial I_{ds}}{\partial V} \text{ and } \frac{\partial Q}{\partial V}$$

for the terminal nodes of said plurality of MOS transistors upon prescription of voltages between gate and source $V_{gs}$, between drain and source $V_{ds}$ and between the substrate and source $V_{bs}$, said parameters being calculated by solving the following equations:

$$Q_i(y) = -C_{ox}(V_G - \phi_S(y)) - Q_b(y)$$

$$Q_b(y) = -qN_{sub}L_D\sqrt{2(\beta\phi_S(y) - 1)}$$

with $$V_G = V_{gs} - V_{fb} - \Delta V_G$$

$$\Delta V_G = \frac{\epsilon_{si}}{C_{ox}} \sqrt{\frac{2\epsilon_{si}}{qN_{sub}} \phi_S(y)E_{yy}}$$

$$\beta = \left[\frac{kT}{q}\right]^{-1}$$

$$Q_I = W \int_0^L Q_i(y)dy$$

$$Q_B = W \int_0^L Q_b(y)dy$$

$$Q_G = -(Q_I + Q_B)$$

-continued $$Q_I = Q_S + Q_D$$

$$Q_D = W \int_0^L \frac{y}{L} Q_i(y) dy$$

$$Q_S = W \int_0^L \left(1 - \frac{y}{L}\right) Q_i(y) dy$$

$$I_{ds} = -\frac{W\mu}{L} \int Q_i(y) \frac{d\phi(y)}{dy}$$

$$\frac{d\phi(y)}{dy} = \frac{d\phi_s(y)}{dy} - \frac{1}{\beta} \frac{d \ln Q_i(y)}{dy}$$

$$-Q_i(y) = qN(y)$$

where:

$C_{ox}$ is oxide capacitance, $\phi_s(y)$ is surface potential, q is electronic charge, $N_{sub}$ is dopant concentration in the substrate, $L_D$ is Debye length, $V_{fb}$ is flat-band voltage, $Q_i(y)$, $Q_b(y)$ are location-dependent charges in the inversion layer or the substrate per unit area, $V_{gs}$ is the voltage between gate and source, $\epsilon_{si}$ is dielectric constant of silicon, $E_{yy}$ is a gradient of a lateral electrical field in the channel, $\beta$ is thermic voltage, $Q_I$, $Q_B$, $Q_G$, $Q_S$, $Q_D$ are respectively overall charge in the inversion layer, in the substrate, in the gate, in the source, and in the drain, W is channel width, L is channel length, $I_{ds}$ is drain current, $\phi(y)$ is quasi-fermi potential, N(y) is a location-dependent dopant concentration in the channel, and $\mu$ is mobility;

using said design and said calculated parameters for each of said plurality of MOS transistors, manufacturing said integrated circuit with said plurality of MOS transistors; and for determining the mobility $\mu$, a current-voltage characteristic $I_{ds}(V_{gs}, V_{ds}, V_{bs})$ of a MOS transistor is measured and assuming that $\mu$ in the channel of the MOS transistor is location independent, calculating $\mu$ from $$I_{ds} \left( \frac{1}{\beta} \mu \frac{W}{L} \right) = C_{ox}(1 + \beta V_G)(\phi_{SL} - \phi_{SO}) - \frac{\beta}{2} C_{ox}(\phi_{SL}^2 - \phi_{SO}^2) -$$

$$qN_{sub}L_D \left( \frac{2\sqrt{2}}{3} \right) ((\beta\phi_{SL} - 1)^{3/2} - (\beta\phi_{SO} - 1)^{3/2}) +$$

$$qN_{sub}L_D \sqrt{2} \ ((\beta\phi_{SL} - 1)^{1/2} - (\beta\phi_{SO} - 1)^{1/2})$$

whereby $\phi_{SO}$ is a surface potential at the source side and $\phi_{SL}$ is a surface potential at the drain side.

3. A method for manufacturing an integrated circuit having a plurality of MOS transistors, comprising the steps of:

employing a circuit simulator to produce a design for the circuit to be integrated containing said plurality of MOS transistors;

calculating with the circuit simulator parameters for the MOS transistors including drain current, charges in the transistor, and voltages across terminals of the transistors given prescription of voltages between gate and source, between drain and source, and between substrate and source, and taking into consideration motion of charge carriers due to drift and due to diffusion as well as due to short-channel effects when making said calculations so that a transistor model is provided which is consistent in describing physical conditions in the transistor without requiring fit parameters, except for mobility of the charge carriers to designate different operating regions of each transistor;

using said design and said calculated parameters for each of said plurality of MOS transistors, manufacturing said integrated circuit with said plurality of MOS transistors; and for determining the mobility $\mu$, a current-voltage characteristic $I_{ds}(V_{gs}, V_{ds}, V_{bs})$ of a MOS transistor is measured and assuming that $\mu$ in the channel of the MOS transistor is location independent, calculating $\mu$ from $$I_{ds} \left( \frac{1}{\beta} \mu \frac{W}{L} \right) = C_{ox}(1 + \beta V_G)(\phi_{SL} - \phi_{SO}) - \frac{\beta}{2} C_{ox}(\phi_{SL}^2 - \phi_{SO}^2) -$$

$$qN_{sub}L_D \left( \frac{2\sqrt{2}}{3} \right) ((\beta\phi_{SL} - 1)^{3/2} - (\beta\phi_{SO} - 1)^{3/2}) +$$

$$qN_{sub}L_D \sqrt{2} \ ((\beta\phi_{SL} - 1)^{1/2} - (\beta\phi_{SO} - 1)^{1/2})$$

where:

$\phi_{SO}$ is a surface potential at the source side, $\phi_{SL}$ is a surface potential at the drain side, $C_{ox}$ is oxide capacitance, W is channel width, L is channel length, $\beta$ is thermic voltage, q is electronic charge, $L_D$ is Debye length, $\phi(y)$ is quasi-fermi potential, $I_{ds}$ is drain-source current, $V_{gs}$ is gate-source voltage, $V_{ds}$ is drain-source voltage, $V_{bs}$ is substrate-source voltage, $N_{sub}$ is dopant concentration in the substrate, $V'_G = V_{gs} - V_{fb} - \Delta V'_G$ $$\Delta V_G = \frac{\epsilon_{si}}{C_{ox}} \sqrt{\frac{2\epsilon_{si}}{qN_{sub}} \phi_s(y) E_{yy}}$$

$V_{fb}$ is flat-band voltage, $\epsilon_{si}$ is dielectric constant of silicon, $E_{yy}$ is a gradient of a lateral electrical field in the channel, and $\phi(y)$ is quasi-fermi potential.

4. A method for manufacturing an integrated circuit having a plurality of MOS transistors, comprising the steps of:

employing a circuit simulator to produce a design for the circuit to be integrated containing said plurality of MOS transistors by employing a transistor model;

calculating with the circuit simulator parameters of the MOS transistors based on said transistor model with said circuit simulator taking into consideration motion of charge carriers due to drift and due to diffusion as well as due to short-channel effects when making said calculations so that a transistor model is provided which is the same in describing physical conditions in the transistor for substantially all operating regions of the transistor without requiring fit parameters, except for mobility of the charge carrier, for different operating regions, or different models for different operating regions, of each transistor;

for determining the mobility μ, a current-voltage characteristic $I_{ds}(V_{gs}, V_{ds}, V_{bs})$ of a MOS transistor is measured and assuming that μ in the channel of the MOS transistor is location independent, calculating μ from $$I_{ds}/\left(\frac{1}{\beta}\mu\frac{W}{L}\right) = C_{ox}(1 + \beta V'_G)(\phi_{SL} - \phi_{SO}) - \frac{\beta}{2}C_{ox}(\phi^2_{SL} - \phi^2_{SO}) -$$

$$qN_{sub}L_D\left(\frac{2\sqrt{2}}{3}\right)((\beta\phi_{SL}-1)^{3/2} - (\beta\phi_{SO}-1)^{3/2}) +$$

$$qN_{sub}L_D\sqrt{2}\ ((\beta\phi_{SL}-1)^{1/2} - (\beta\phi_{SO}-1)^{1/2})$$

where:
$\phi_{SO}$ is a surface potential at the source side,
$\phi_{SL}$ is a surface potential at the drain side,
$C_{ox}$ is oxide capacitance,
W is channel width,
L is channel length,
β is thermic voltage,
q is electronic charge,
$L_D$ is Debye length,
$\phi_f(y)$ is quasi-fermi potential,
$I_{ds}$ is drain-source current,
$V_{gs}$ is gate-source voltage,
$V_{ds}$ is drain-source voltage,
$V_{bs}$ is substrate-source voltage,
$N_{sub}$ is dopant concentration in the substrate,
$V'_G = V_{gs} - V_{fb} - \Delta V'_G$ $$\Delta V_G = \frac{\epsilon_{si}}{C_{ox}}\sqrt{\frac{2\epsilon_{si}}{qN_{sub}}\phi_S(y)E_{yy}}$$

$V_{fb}$ is flat-band voltage,
$\epsilon_{si}$ is dielectric constant of silicon,
$E_{yy}$ is a gradient of a lateral electrical field in the channel, and
$\phi_f(y)$ is quasi-fermi potential; and using said design and said calculated parameters for each of said plurality of MOS transistors, manufacturing said integrated circuit with said plurality of MOS transistors.

* * * * *